US005635328A

United States Patent [19]
Higashino et al.

[11] Patent Number: 5,635,328
[45] Date of Patent: Jun. 3, 1997

[54] LIGHT-SENSITIVE LITHOGRAPHIC PRINTING PLATE UTILIZING O-QUINONE DIAZIDE LIGHT-SENSITIVE LAYER CONTAINING CYCLIC CLATHRATE COMPOUND

[75] Inventors: Katuhiko Higashino; Kaori Fukumuro; Shinichi Matsubara, all of Hino; Mitsuru Sasaki, Yokohama; Katsuko Ohta, Yokohama; Fumiyuki Matsuo, Yokohama, all of Japan

[73] Assignees: Konica Corporation; Mitsubishi Chemical Corporation, both of Tokyo, Japan

[21] Appl. No.: 291,197

[22] Filed: Aug. 16, 1994

[30] Foreign Application Priority Data

Aug. 21, 1993 [JP] Japan .................. 5-228046

[51] Int. Cl.[6] .................. G03F 7/023; G03C 1/61
[52] U.S. Cl. .................. 430/166; 430/165; 430/191
[58] Field of Search .................. 430/191, 165, 430/166, 302, 190, 192, 193

[56] References Cited

U.S. PATENT DOCUMENTS

| | | | |
|---|---|---|---|
| 3,801,330 | 4/1974 | Brinckman et al. | 430/353 |
| 4,693,915 | 9/1987 | Matsuda et al. | 430/270 |
| 4,724,201 | 2/1988 | Okazaki et al. | 430/570 |
| 4,914,004 | 4/1990 | Kohler et al. | 430/272 |
| 5,019,476 | 5/1991 | Kanno et al. | 430/20 |
| 5,049,467 | 9/1991 | Yamanaka | 430/110 |
| 5,071,732 | 12/1991 | Kohler et al. | 430/272 |
| 5,340,631 | 8/1994 | Matsuzawa et al. | 430/945 |
| 5,352,563 | 10/1994 | Kawasaki et al. | 430/264 |
| 5,376,509 | 12/1994 | Yoshimoto et al. | 430/449 |

*Primary Examiner*—Christopher G. Young
*Attorney, Agent, or Firm*—Frishauf, Holtz, Goodman, Langer & Chick, P.C.

[57] ABSTRACT

Disclosed are a light-sensitive lithographic printing plate which comprises a support subjected to graining treatment and anodization treatment and a layer of a positive light-sensitive composition containing a o-quinonediazide compound, an alkali-soluble resin and a clathrate compound provided on the support, and a method of processing the same which comprises subjecting the plate to image exposure and then development processing with a developing agent containing an alkali metal silicate.

11 Claims, No Drawings

LIGHT-SENSITIVE LITHOGRAPHIC PRINTING PLATE UTILIZING O-QUINONE DIAZIDE LIGHT-SENSITIVE LAYER CONTAINING CYCLIC CLATHRATE COMPOUND

BACKGROUND OF THE INVENTION

This invention relates to a positive type light-sensitive lithographic printing plate (or a positive type presensitized plate) and a development processing method of the positive type light-sensitive lithographic printing plate.

A light-sensitive lithographic printing plate comprises a light-sensitive layer provided on a hydrophilic support. For example, in a positive type light-sensitive lithographic printing plate, an ink-receivable light-sensitive layer which is made, soluble by exposure of active light such as UV ray is formed on a hydrophilic support.

In such a positive type light-sensitive lithographic printing plate, when a light-sensitive layer is subjected to image exposure and then the plate is developed, a portion exposed to light of the light-sensitive layer which is ink-receivable is removed to expose the surface of the hydrophilic support, while the ink-receivable light-sensitive layer which is not subjected to exposed to light remains on the support to form an ink-receivable layer. In lithographic printing, there is utilized such a difference in properties that the portion exposed to light is hydrophilic and the portion which is not exposed to light is lipophilic.

In general, a light-sensitive composition containing a o-quinonediazide compound as a light-sensitive component and an alkali-soluble resin as a component of heightening film strength and alkali-soluble property have been used in a light-sensitive layer of a positive type light-sensitive lithographic printing plate.

As the above o-quinonediazide compound, a 1,2-naphthoquinone-2-diazide-5-sulfonate compound and a 1,2-naphthoquinone-2-diazide-4-sulfonate compound have been used as useful ones. Particularly preferred is an ester compound of a polycondensed resin having a o-quinonediazide group such as a polycondensed resin of pyrogallol with an aldehyde or an ketone.

When an ester compound with a polycondensed resin is used as the o-quinonediazide compound, a polycondensed resin having a weight average molecular weight of 3,000 or more has been generally used for the purpose of improving press life.

As to development, there has been used a method in which development is carried out by replenishing a developing replenishing solution in order to replenish a developing solution component consumed by development processing.

When a positive type light-sensitive lithographic printing plate using a o-quinonediazide compound as described above is developed while replenishing a developing replenishing solution, a large amount of a developing replenishing solution is replenished so that a developing solution is in a fatigued state. Under such a state, when the light-sensitive lithographic printing plate is developed by using a step tablet (generally each concentration difference of 0.15, gray scale of 21 grades) for measuring sensitivity as a manuscript, a phenomenon that a portion corresponding to an intermediate tone portion of the step tablet of the lithographic printing plate becomes red is caused, and also a phenomenon that a red portion cannot be erased by a generally used erasing solution (correcting solution) is caused. In practical operation of processing a lithographic printing plate, these phenomena cause a problem that a portion corresponding to an edge portion of a film which is a manuscript frequently remains on a printing plate as an unnecessary image portion and the unnecessary image portion cannot be erased. Thus, there is a problem that a portion corresponding to a film edge portion which cannot be erased is inked to cause printing failure.

The above problem remarkably occurs particularly when a positive type light-sensitive composition is provided on a support subjected to graining treatment and anodization treatment as in a common light-sensitive lithographic printing plate and further remarkably occurs when an ester compound of a polycondensed resin is used as a o-quinonediazide compound.

It has been known that in order to solve the above problem that an intermediate tone portion becomes red, that is, a problem that a portion corresponding to an edge of a film which is a manuscript cannot be erased, a method of lowering a molecular weight of a polycondensed resin or adding a large amount of an organic acid or an inorganic acid to a light-sensitive layer is used.

However, in the above method for solving the problem, there is a problem that press life is lowered or the like, and further improvement has been demanded.

As a method for processing a light-sensitive lithographic printing plate in which developability is good even when repeated development processings are carried out for a long period of time and also precipitates (sludge) are not generated in a developing solution bath, there have been proposed a method of carrying out development by replenishing a replenishing solution comprising a solution of an alkali metal silicate having $[SiO_2]/[M]$ (where $[SiO_2]$ represents a molar concentration of $SiO_2$ and $[M]$ represents a molar concentration of an alkali metal) of 0.15 to 0.5 and a $SiO_2$ concentration of 1.0 to 3.0 % by weight based on the total weight of the replenishing solution in Japanese Provisional Patent Publication No. 2273/1993 and a method of providing a back coat layer on the back surface of a support to which graining treatment is subjected in Japanese Provisional Patent Publication No. 35174/1994. However, even when a plate is made by using the development method or light-sensitive lithographic printing plate described above, a phenomenon that an intermediate tone portion of a developed light-sensitive lithographic printing plate becomes red is caused and a red portion cannot be erased. That is, a problem of erasing failure of a film edge portion is caused. Red color at the intermediate tone portion can be reduced by lowering a $SiO_2$ concentration of a developing solution and a developing replenishing solution, but when the $SiO_2$ concentration is lowered, there is a problem that precipitates in a developing solution bath are increased. Further, by providing a hydrophilic layer on a support subjected to graining treatment of a light-sensitive lithographic printing plate, erasing failure of a film edge portion and generation of precipitates in a developing solution bath can be controlled to some extent, but the effects are small and insufficient.

SUMMARY OF THE INVENTION

An object of the present invention is to provide a positive type light-sensitive lithographic printing plate and a development processing method thereof, in which press life is not lowered, good sensitivity can be obtained, developability is good even in repeated development processing for a long period of time and also precipitates are not generated in a developing solution bath.

The above object of the present invention can be accomplished by (1) a light-sensitive lithographic printing plate which comprises a support subjected to graining treatment and anodization treatment and a layer of a positive type light-sensitive composition containing a o-quinonediazide compound, an alkali-soluble resin and a clathrate compound provided on the support, (2) the light-sensitive lithographic printing plate described in the above (1) wherein the o-quinonediazide compound is a polycondensed resin having a o-quinonediazide group and a weight average molecular weight of 3,000 to 10,000, (3) the light-sensitive lithographic printing plate described in the above (1) or (2) wherein the o-quinonediazide compound is a polycondensed resin of pyrogallol having a o-quinonediazide group and an aldehyde or a ketone, (4) the light-sensitive lithographic printing plate described in the above (1) to (3) wherein the clathrate compound is at least one selected from the group consisting of cyclic D-glucans and cyclophans, (5) the light-sensitive lithographic printing plate described in the above (1) to (4) wherein the clathrate compound is at least one selected from the group consisting of cyclodextrin and a cyclodextrin derivative, (6) the light-sensitive lithographic printing plate described in the above (5) wherein the cyclodextrin in cyclodextrin and a cyclodextrin derivative is a β type cyclodextrin, (7) the light-sensitive lithographic printing plate described in the above (1) to (6) wherein the support is subjected to graining treatment, anodization treatment and pore-sealing treatment and then a hydrophilic layer is provided on the support, (8) a method of processing the light-sensitive lithographic printing plate described in the above (1) to (7), which comprises subjecting the plate to image exposure and then development processing with a developing agent containing an alkali metal silicate, and (9) the method of processing the light-sensitive lithographic printing plate described in the above (8) wherein the development processing is carried out by using at least one of a developing solution and a developing replenishing solution having $[SiO_2]/[M]$ (where $[SiO_2]$ represents a molar concentration of $SiO_2$ and $[M]$ represents a molar concentration of an alkali metal) of 0.15 to 1.0 and a $SiO_2$ concentration of 0.5 to 5.0% by weight based on the total weight of the solution.

DESCRIPTION OF THE PREFERRED EMBODIMENTS

In the following, the present invention is explained in detail.

First, the o-quinonediazide compound, alkali-soluble resin and clathrate compound to be used in a layer of a positive type light-sensitive composition of the present invention are described.

The o-quinonediazide compound to be used in a layer of a positive type light-sensitive composition of the present invention is a compound having a o-quinonediazide group in a molecule. The o-quinonediazide compound to be used in the present invention is not particularly limited and may include, for example, an ester compound of a polycondensed resin having a o-quinonediazide group, for example, a polycondensed resin of o-naphthoquinonediazidesulfonic acid, a phenol and an aldehyde or a ketone.

As the phenol in the above polycondensed resin of a phenol and an aldehyde or a ketone, there may be mentioned, for example, a monovalent phenol such as phenol, o-cresol, m-cresol, p-cresol, 3,5-xylenol, carvacrol and thymol, a divalent phenol such as catechol, resorcin and hydroquinone and a trivalent phenol such as pyrogallol and phloroglucin.

As the aldehyde, there may be mentioned, for example, formaldehyde, benzaldehyde, acetaldehyde, crotonaldehyde and furfural. Among them, formaldehyde and benzaldehyde are preferred. As the ketone, there may be mentioned, for example, acetone and methyl ethyl ketone.

As a specific example of the polycondensed resin of a phenol and an aldehyde or a ketone, there may be mentioned a phenol.formaldehyde resin, a m-cresol.formaldehyde resin, a m- and p-mixed cresol.formaldehyde resin, a resorcin.benzaldehyde resin and a pyrogallol.acetone resin.

In the above o-naphthoquinonediazide compound, the condensation ratio of o-naphthoquinonediazidesulfonic acid based on a OH group of the phenol (reactivity based on one OH group) is preferably 15% to 80%, more preferably 20% to 45%.

Further, as the o-quinonediazide compound to be used in the present invention, there may be mentioned the following compounds described in Japanese Provisional Patent Publication No. 43451/1983, i.e., known 1,2-quinonediazide compounds such as 1,2-benzoquinonediazidesulfonate, 1,2-naphthoquinonediazidesulfonate, 1,2-benzoquinonediazidesulfonic acid amide and 1,2-naphthoquinonediazidesulfonic acid amide. As a further specific example thereof, there may be mentioned 1,2-quinonediazide compounds such as phenyl 1,2-benzoquinonediazide-4-sulfonate, 1,2,1',2'-di-(benzoquinonediazide-4-sulfonyl)dihydroxybiphenyl, 1,2-benzoquinonediazide-4-(N-ethyl-N-β-naphthyl) sulfonamide, cyclohexyl 1,2-naphthoquinonediazide-5-sulfonate, 1-(1,2-naphthoquinonediazide-5-sulfonyl)-3,5-dimethylpyrazole, 1,2-naphthoquinonediazide-5-sulfonic acid-4'-hydroxydiphenyl-4'-azo-β-naphthol ester, N,N-di-(1,2-naphthoquinonediazide-5-sulfonyl)aniline, 2'-(1,2-naphthoquinonediazide-5-sulfonyloxy)-1-hydroxyanthraquinone, 1,2-naphthoquinonediazide-5-sulfonic acid-2,4-dihydroxybenzophenone ester, 1,2-naphthoquinonediazide-5-sulfonic acid-2,3,4-trihydroxybenzophenone ester, a condensate of 2 mole of 1,2-naphthoquinonediazide-5-sulfonic acid chloride and 1 mole of 4,4'-diaminobenzophenone, a condensate of 2 mole of 1,2-naphthoquinonediazide-5-sulfonic acid chloride and 1 mole of 4,4'-dihydroxy-1,1'-diphenylsulfonic acid, a condensate of 1 mole of 1,2-naphthoquinonediazide-5-sulfonic acid chloride and 1 mole of purpurogallin, and 1,2-naphthoquinonediazide-5-(N-dihydroabietyl)sulfonamide described in J. Kosar, "Light-Sensitive Systems, pp. 339 to 352 (1965), John Willey & Sons Co. (New York) and W. S. De Forest, "Photoresist", Vol. 50 (1975), McGraw Hill Co. (New York). Also, there may be mentioned 1,2-quinonediazide compounds described in Japanese Patent Publications No. 1953/1962, No. 3627/1962, No. 13109/1962, No. 26126/1965, No. 3801/1965, No. 5604/1970, No. 27345/1970 and No. 13013/1976 and Japanese Provisional Patent Publications No. 96575/1973, No. 63802/1973 and No. 63803/1973.

Among the above o-quinonediazide compounds, particularly preferred is a o-quinonediazide ester compound obtained by reacting 1,2-benzoquinonediazidesulfonyl chloride or 1,2-naphthoquinonediazidesulfonyl chloride with a pyrogallol.acetone condensed resin or 2,3,4-trihydroxybenzophenone.

The molecular weight of the o-quinonediazide compound is generally a weight average molecular weight (Mw) based on polystyrene of 2,000 to 12,000, preferably 3,000 to 10,000, more preferably 3,000 to 5,000.

In the present invention, as the o-quinonediazide compound, the above compounds may be used singly or in combination of two or more, respectively.

The ratio of the o-quinonediazide compound in the light-sensitive composition is preferably 5 to 60% by weight, particularly preferably 10 to 50% by weight.

The alkali-soluble resin which can be used in the present invention is not particularly limited and may include, for example, a novolak resin, a vinyl type polymer having a phenolic hydroxyl group and a condensed resin of a polyvalent phenol and an aldehyde or a ketone described in Japanese Provisional Patent Publication No. 57841/1980.

As the novolak resin which can be used in the present invention, there may be mentioned, for example, a phenol-.formaldehyde resin, a cresol.formaldehyde resin, a phenol-cresol.formaldehyde copolymer resin as described in Japanese Provisional Patent Publication No. 57841/1980 and a copolymer resin of p-substituted phenol and a phenol, or cresol and a formaldehyde as described in Japanese Provisional Patent Publication No. 127553/1980.

As to the molecular weight (based on polystyrene) of the novolak resin, it is preferred that the number average molecular weight (Mn) is $3.00 \times 10^2$ to $7.50 \times 10^3$ and the weight average molecular weight (Mw) is $1.00 \times 10^3$ to $3.00 \times 10^4$. It is more preferred that Mn is $5.00 \times 10^2$ to $4.00 \times 10^3$ and Mw is $3.00 \times 10^3$ to $2.00 \times 10^4$.

The above novolak resins may be used singly or in combination or two or more.

The novolak resin is contained in the light-sensitive composition preferably in an amount of 5 to 95% by weight.

Further, the vinyl type polymer having a phenolic hydroxyl group is a polymer having a unit having the phenolic hydroxyl group in a molecular structure, preferably a polymer having at least one of the constitutional units represented by the following formulae (I) to (V):

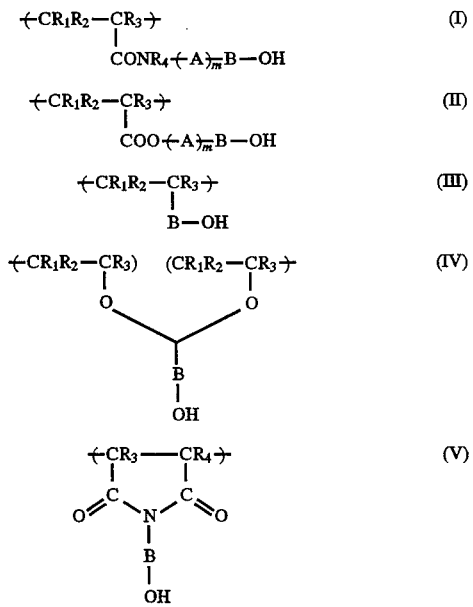

In the formulae (I) to (V), $R_1$ and $R_2$ each represent a hydrogen atom, an alkyl group or a carboxyl group, preferably a hydrogen atom. $R_3$ represents a hydrogen atom, a halogen atom or an alkyl group, preferably a hydrogen atom or an alkyl group such as a methyl group and an ethyl group. $R_4$ represents a hydrogen atom, an alkyl group, an aryl group or an aralkyl group, preferably a hydrogen atom. A represents a substituted or unsubstituted alkylene group which links a nitrogen atom or an oxygen atom with an aromatic carbon atom. m represents an integer of 0 to 10. B represents a substituted or unsubstituted phenylene group or a substituted or unsubstituted naphthylene group.

The vinyl type polymer having the above phenolic hydroxyl group to be used in the present invention preferably has a copolymer type structure having the constitutional units represented by the above formula (I) to formula (V). As a monomer to be copolymerized, there may be mentioned ethylenic unsaturated olefins such as ethylene, propylene, isobutylene, butadiene and isoprene; styrenes such as styrene, α-methylstyrene, p-methylstyrene and p-chlorostyrene; acrylic acids such as acrylic acid and methacrylic acid; unsaturated aliphatic dicarboxylic acids such as itaconic acid, maleic acid and maleic anhydride; esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate and ethyl ethacrylate; nitriles such as acrylonitrile and methacrylonitrile; amides such as acrylamide and methacrylamide; anilides such as acrylanilide, p-chloroacrylanilide, m-nitroacrylanilide and m-methoxyacrylanilide; vinyl esters such as vinyl acetate, vinyl propionate and vinyl benzoate; vinyl ethers such as methyl vinyl ether, ethyl vinyl ether, isobutyl vinyl ether and β-chloroethyl vinyl ether; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene and 1-methyl-1-nitroethylene; and N-vinyl type monomers such as N-vinylpyrrole, N-vinylcarbazole, N-vinylindole, N-vinylpyrrolidene and N-vinylpyrrolidone. These monomers exist in a polymer compound in a structure of a cleaved double bond.

Among the above monomers, preferred are esters of aliphatic monocarboxylic acid and nitriles which show excellent characteristics to obtain the effect of the present invention.

These monomers may be bonded in the polymer to be used in the present invention in either of a block or random state.

The vinyl type polymer having a phenolic hydroxyl group is contained in the light-sensitive composition preferably in an amount of 0.5 to 70% by weight.

The above vinyl type polymers having a phenolic hydroxyl group may be used singly or in combination of two ore more, and further may be used in combination with other high molecular weight compound.

The clathrate compound which can be used in the present invention is not particularly limited so long as it is a compound which can include water or an organic molecule, but it is preferably an organic compound which can be solved in a solvent used for preparing the composition. As an example of such an organic compound, there may be mentioned, for example, compounds described in Michio Hiraoka et al., "Host Guest Chemistry", published by Kodansha, 1984, Tokyo; A. Collet et al., "Tetrahedron Report", No. 226, p. 5725 (1987); Shinkai et al., "Chemistry and Chemical Industry" for April, p. 278 (1991) and Hiraoka et al., "Chemistry and Chemical Industry" for April, p. 288 (1991).

As the clathrate compound which can be preferably used in the present invention, there may be mentioned, for example, cyclic D-glucans, cyclophans, neutral polyligands, cyclic polyanions, cyclic polycations, cyclic peptides, spherands, cavitands and non-cyclic analogues thereof.

Among them, cyclic D-glucans and non-cyclic analogues thereof, and cyclophans are more preferred.

As an example of the D-glucans and non-cyclic analogues thereof, there may mentioned a compound in which α-D-glucopyranoses are linked by a glycoxide bonding.

As such a compound, there may be mentioned glucides constituted by a D-glucopyranose group such as starch, amylose and amylopectin; cyclodextrins such as α-cyclodextrin, β-cyclodextrin, γ-cyclodextrin and cyclodextrin in which a D-glucopyranose group-polymerization degree is 9 or more; and modified D-glucans in which a substituent such as a $SO_3C_6H_4CH_2C_6H_4SO_3$ group, a $NHCH_2CH_2NH$ group, a $NHCH_2CH_2NHCH_2CH_2NH$ group, a $SC_6H_5$ group, a $N_3$ group, a $NH_2$ group, a $NEt_2$ group, a $SC(NH_2^+)NH_2$ group, a $SH$ group, a $SCH_2CH_2NH_2$ group, an imidazole group and an ethylenediamine group, represented by the following formulae:

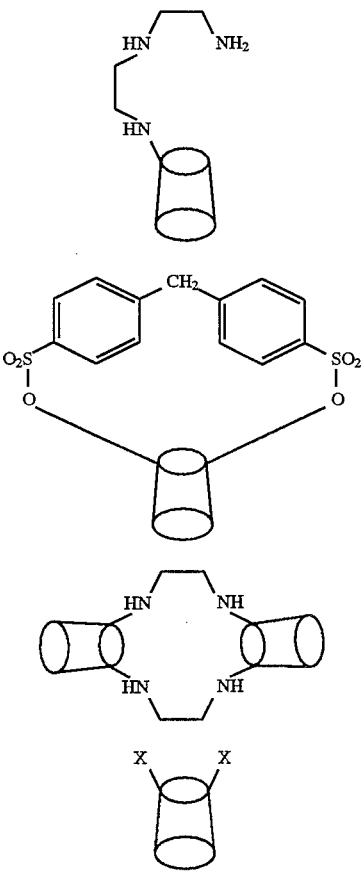

wherein X represents $C_6H_5$, $N_3$, $NH_2$, $N(C_2H_5)_2$, $SC(NH_2^+)$ $NH_2$, $SH$, $SCH_2CH_2NH_2$ or

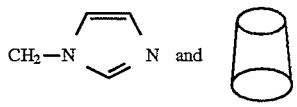

represents cyclodextrin.

Also, there may be mentioned cyclodextrin derivatives represented by the following formulae (VI) and (VII), a branched cyclodextrin and a cyclodextrin polymer.

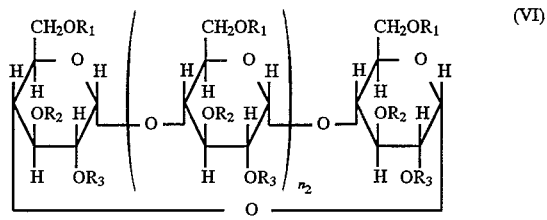

In the formula (VI), $R_1$ to $R_3$ may be the same or different from each other and each represent a hydrogen atom, an alkyl group or a substituted alkyl group. Each of $R_1$ to $R_3$ is particularly preferably a hydrogen atom, a hydroxyethyl group or a hydroxypropyl group, further preferably one containing a substituted alkyl group in one molecule of 15% to 50%. $n_2$ represents a positive integer of 4 to 10.

In the formula (VII), R represents a hydrogen atom, —$R^2$—$CO_2H$, —$R^2$—$SO_3H$, —$R^2$—$NH_2$ or —N—$(R^3)_2$ (where $R^2$ represents a straight or branched alkylene group having 1 to 5 carbon atoms and $R^3$ represents a straight or branched alkyl group having 1 to 5 carbon atoms).

Cyclodextrin can be prepared by the method as described, for example, in "Journal of the American Chemical Society", Vol. 71, p. 354, 1949 or "Cheimish Berichte", Vol. 90, p. 2561, 1949 and Vol. 90, p. 2561, 1957, but the method is not limited thereto.

The branched cyclodextrin to be used in the present invention is a branched cyclodextrin obtained by adding or bonding, as a branched group, a water-soluble substance such as a monosaccharide and a disaccharide including glucose, maltose, cellobiose, lactose, sucrose, galactose and glucosamine to a known cyclodextrin, preferably maltocyclodextrin in which maltose is bonded to a cyclodextrin (the number of bonding molecules of maltose is not limited and may be 1, 2 or 3) or glucocyclodextrin in which glucose is bonded to cyclodextrin (the number of bonding molecules of glucose is not limited and may be 1, 2 or 3).

Specific synthetic methods of these branched cyclodextrins are described in, for example, "Starch Chemistry", Vol. 33, No. 2, pp. 119 to 126 (1986), Ditto, pp. 127 to 132 (1986) and "Starch Chemistry", Vol. 30, No. 2, pp. 231 to 239 (1983). The branched cyclodextrins can be synthesized by referring these known mehtods and, for example, maltocyclodextrin can be prepared by a method in which cyclodextrin and maltose are used as starting materials and maltose is bonded to cyclodextrin by using an enzyme such as isoamylase and pullulanase. Glucocyclodextrin can be also prepared by the same method.

As a branched cyclodextrin which is preferably used in the present invention, there may be mentioned the following specific exemplary compounds.
(Exemplary compounds)

D-1 α-cyclodextrin to which one molecule of maltose is bonded

D-2 β-cyclodextrin to which one molecule of maltose is bonded

D-3 γ-cyclodextrin to which one molecule of maltose is bonded

D-4 α-cyclodextrin to which two molecules of maltose are bonded

D-5 β-cyclodextrin to which two molecules of maltose are bonded

D-6 γ-cyclodextrin to which two molecules of maltose are bonded

D-7 α-cyclodextrin to which three molecules of maltose are bonded

D-8 β-cyclodextrin to which three molecules of maltose are bonded

D-9 γ-cyclodextrin to which three molecules of maltose are bonded

D-10 α-cyclodextrin to which one molecule of glucose is bonded

D-11 β-cyclodextrin to which one molecule of glucose is bonded

D-12 γ-cyclodextrin to which one molecule of glucose is bonded

D-13 α-cyclodextrin to which two molecules of glucose are bonded

D-14 β-cyclodextrin to which two molecules of glucose are bonded

D-15 γ-cyclodextrin to which two molecules of glucose are bonded

D-16 α-cyclodextrin to which three molecules of glucose are bonded

D-17 β-cyclodextrin to which three molecules of glucose are bonded

D-18 γ-cyclodextrin to which three molecules of glucose are bonded

Structures of these branched cyclodextrins have been investigated variously by measurement methods such as HPLC (high performance liquid chromatography), NMR (nuclear magnetic resonance), TLC (thin layer chromatography) and INEPT (Insensitive nuclei enhanced by polarization transfer) methods. However, the structures have not yet been clarified and can be only estimated. The fact that each monosaccharide or disaccharide is bonded to cyclodextrin has been clarified by the above measurement methods. Therefore, in the present invention, when molecules of the monosaccharide or disaccharide are bonded to cyclodextrin, included are both of the case where the molecules are bonded to glucoses of cyclodextrin, respectively and the case where the molecules are bonded to one glucose straightly as shown below.

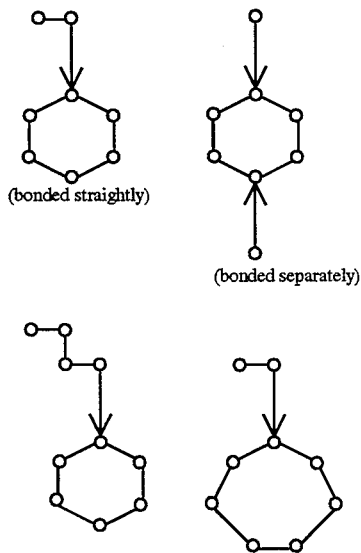

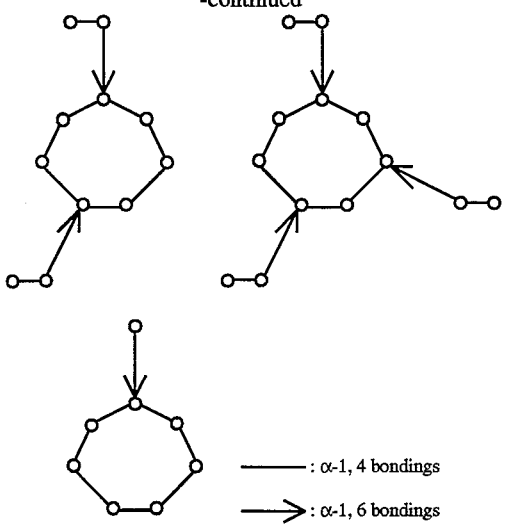

In these branched cyclodextrins, their existing cyclic structures are maintained as such so that they have characteristics that the same clathrate action as that of the existing cyclodextrins is exhibited, and highly water-soluble maltose or glucose is added so that solubility in water is improved significantly.

The branched cyclodextrin to be used in the present invention can be obtained as a commercially available product. For example, maltocyclodextrin is commercially available as Isoelite (trade name) produced by Ensuiko Seito Co.

Next, the cyclodextrin polymer to be used in the present invention is described.

As the cyclodextrin polymer to be used in the present invention, a cyclodextrin polymer represented by the following formula (VIII) is preferred.

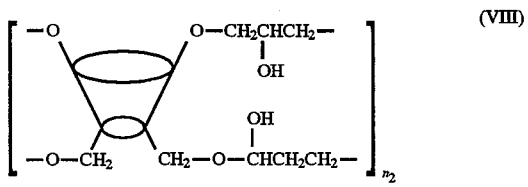

wherein $n_2$ represents a polymerization degree of 3 to 4.

The cyclodextrin polymer to be used in the present invention can be prepared by crosslinking and polymerizing cyclodextrin using, for example, epichlorohydrin.

The above cyclodextrin polymers preferably have the water-solubility, i.e., solubility in water of 20 g or more per 100 ml of water at 25° C. In order to obtain the water-solubility in the above range, a polymerization degree $n_2$ is preferably made 3 or 4. As the polymerization degree is smaller, effects of making cyclodextrin itself water-soluble and making the above compounds soluble are high.

These cyclodextrin polymers can be sunthesized by a common method described in, for example, Japanese Provisional Patent Publication No. 97025/1986 and German Patent No. 35 44 842.

The cyclodextrin polymers may be used as a clathrate compound of the cyclodextrin polymer as described above.

The cyclophans is cyclic compounds each having a structure that aromatic rings are linked by various bonds and many compounds have been known. As the cyclophans, there may be mentioned these known compounds.

As the bonds which link aromatic rings, there may be mentioned a single bond, a —(CR$_1$R$_2$)$_m$— bond, a —O(CR$_1$R$_2$)$_m$O— bond, a —NH(CR$_1$R$_2$)$_m$NH— bond, a —(CR$_1$R$_2$)$_p$NR$_3$(CR$_4$R$_5$)$_q$— bond, a —(CR$_1$R$_2$)$_p$N$^+$R$_3$R$_4$(CR$_5$R$_6$)$_q$— bond, a —(CR$_1$R$_2$)$_p$SR$_3$(CR$_4$R$_5$)$_q$— bond, a —CO$_2$— bond and a —CONR$_7$— bond (where R$_1$, R$_2$, R$_3$, R$_4$, R$_5$, R$_6$ and R$_7$ may be the same or different and each represent a hydrogen atom or an alkyl group having 1 to 3 carbon atoms, and m, p and q may be the same or different and each represent an integer of 1 to 4).

As the above compounds, there may be mentioned, for example, paracyclophans represented by the following formulae:

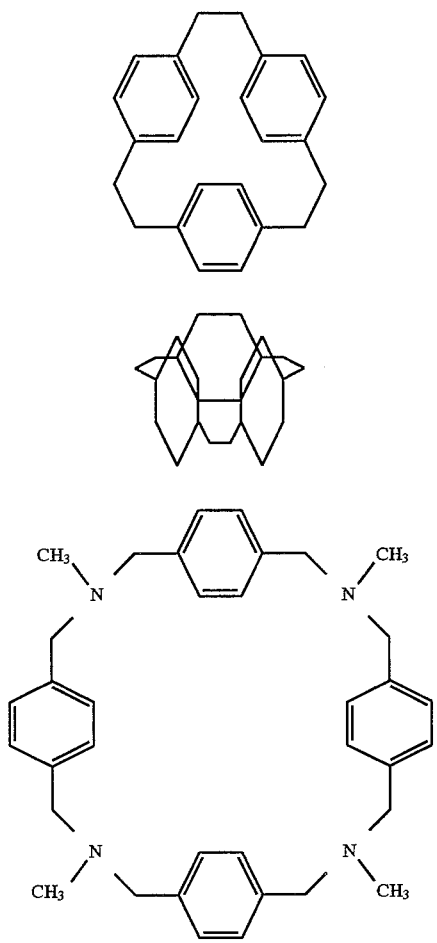

wherein

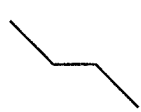

represents —CH$_2$CH$_2$—, orthocyclophans represented by tri-o-thymotide and cyclo toriveratrilen, represented by the following formulae:

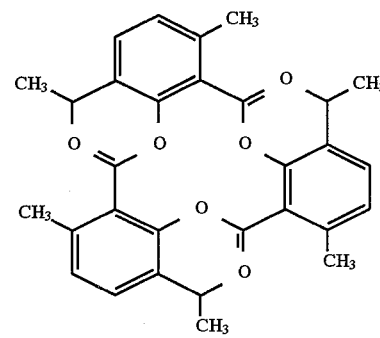

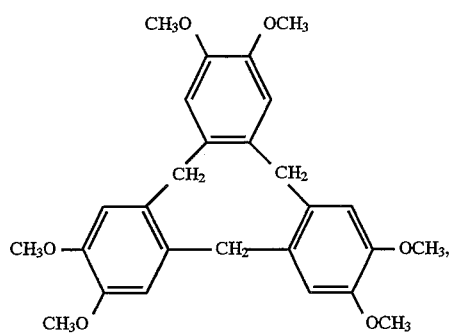

metacyclophans represented by metacyclophan, callix allene and a resorcinol-aldehyde cyclic oligomer, represented by the following formulae:

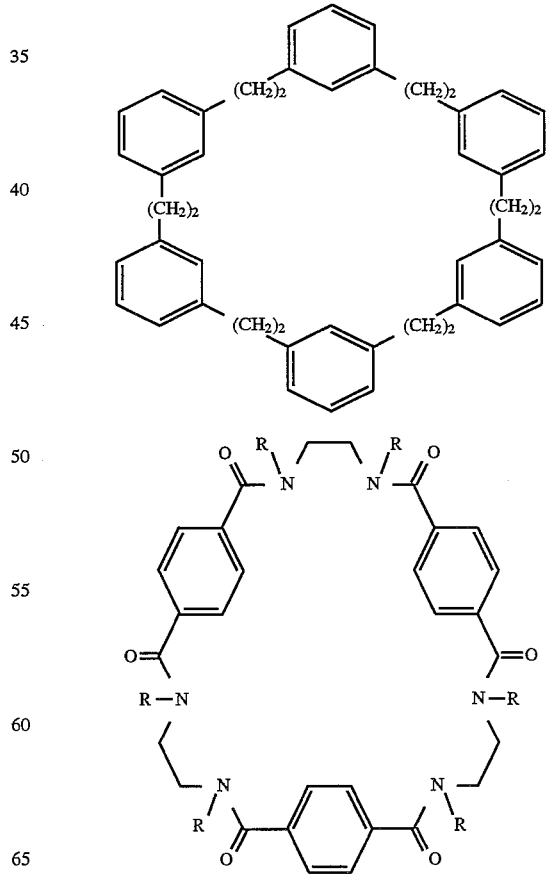

wherein R represents $CH_2C_6H_5$,

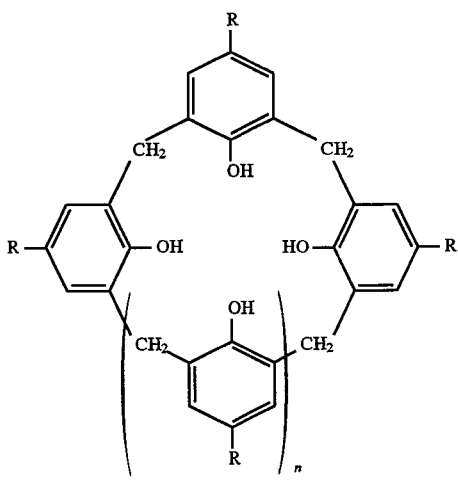

wherein R represents Cl, $CH_3$, t—$C_4H_9$, $C_6H_5$, $CO_2C_2H_5$ or i—$C_3H_7$, and n represents 4, 5, 6, 7 or 8,

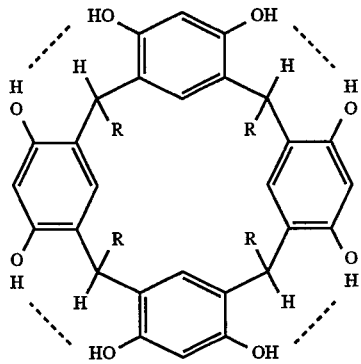

wherein R represents $CH_3$ or $C_6H_5$, and a p-substituted phenol non-cyclic oligomer represented by the following formula:

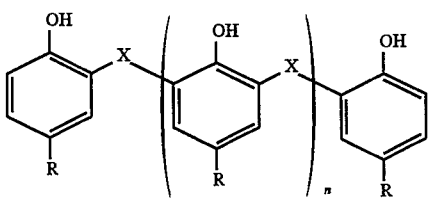

wherein X represents —$CH_2$—, —S— or a single bond, R represents $CH_3$ or t—$C_4H_9$ and n represents an integer of 1 to 10.

As the neutral polyligand, there may be mentioned a crown compound, a criptand, a cyclic polyamine and non-cyclic analoques thereof. It has been known that the neutral polyligand takes a metallic ion therein effectively, but it can also take a cationic organic molecule therein effectively.

As the other clathrate compounds, there may be mentioned urea, thiourea, deoxycholic acid, dinitrodiphenyl, hydroquinone, o-trithymotide, oxyflavan, dicyanoamminenickel, dioxytriphenylmethane, triphenylmethane, methylnaphthalene, spirochroman, perhydrotriphenylene, a clay mineral, graphite, a zeolite (e.g., faujasite, chabazite, mordenite, levynite, montmorillonite and halosite), cellulose, amylose, and protein.

These clathrate compounds may be added singly or may be added together with a polymer in which a substituent having clathrate property is suspended as a pendant substituent for the purpose of improving solubility in a solvent and compatibility with other additives of the clathrate compound itself or the clathrate compound in which a molecule is taken in.

The above polymer can be obtained easily by using a method disclosed in, for example, Japanese Provisional Patent Publications No. 221501/1991, No. 221502/1991, No. 221503/1991, No. 221504/1991 and No. 221505/1991.

Among the above clathrate compounds, cyclic and non-cyclic D-glucans, cyclophans and non-cyclic cyclophan analogues are preferred. More specifically, cyclodextrin, callix allene, a resorcinol-aldehyde cyclic oligomer and a p-substituted phenol non-cyclic oligomer are preferred.

As the most preferred clathrate compound, there may be mentioned cyclodextrins and derivatives thereof. Among them, β-cyclodextrin and a derivative thereof are more preferred.

The ratio of these clathrate compounds in the light-sensitive composition is preferably 0.01 to 10% by weight, more preferably 0.1 to 5% by weight.

To the positive type light-sensitive composition layer of the present invention, a print-out material which forms a visible image by exposure to light may be added. The print-out material comprises a compound which forms an acid or a free group by exposure and an organic dye which changes its color tone by interaction with the acid or free group formed. As the compound which forms an acid or a free group by exposure, there may be mentioned, for example, o-naphthoquinonediazide-4-sulfonic acid halogenide described in Japanese Provisional Patent Publication No. 36209/1975, trihalomethyl-2-pyrone and trihalomethyl-triazine described in Japanese Provisional Patent Publication No. 36223/1978, an ester compound or an amide compound comprising o-naphthoquinonediazide-4-sulfonic acid chloride and a phenol having an electron-attracting substituent or aniline described in Japanese Provisional Patent Publication No. 6244/1980, and a halomethylvinyloxadiazole compound and a diazonium salt described in Japanese Provisional Patent Publications No. 77742/1980 and No. 148784/1982. As the organic dye, there may be mentioned, for example, Victoria Pure Blue BOH (trade name, produced by Hodogaya Kagaku K.K.), Patent Pure Blue (trade name, produced by Sumitomo Mikuni Kagaku K.K.), Oil Blue #603 (trade name, produced by Orient Kagaku Kogyo K.K.), Sudan Blue II (trade name, produced by BASF), Crystal Violet, Malachite Green, Fuchsin, Methyl Violet, Ethyl Violet, Methyl Orange, Brilliant Green, Congo Red, Eosin and Rhodamine 66.

To the positive type light-sensitive composition layer of the present invention, in addition to the materials described above, a plasticizer, a surfactant, an organic acid and an acid anhydride may be added, if necessary.

To the positive type light-sensitive composition layer of the present invention, for example, a p-tert-butylphenolformaldehyde resin, a p-n-octylphenolformaldehyde resin or a resin in which the above resin is partially esterified with an o-quinonediazide compound may be further added in order to improve ink receptivity of the light-sensitive composition.

The positive type light-sensitive composition layer of the present invention can be formed by dissolving or dipersing a light-sensitive composition comprising these respective components and coating the resulting coating solution on a support, followed by drying.

As the solvent which can be used for dissolving the light-sensitive composition, there may be mentioned, for example, methyl cellosolve, methyl cellosolve acetate, ethyl cellosolve, ethyl cellosolve acetate, diethylene glycol monomethyl ether, diethylene glycol monoethyl ether, diethylene glycol dimethyl ether, diethylene glycol methyl ethyl ether, diethylene glycol diethyl ether, diethylene glycol monoisopropyl ether, propylene glycol, propylene glycol monoethyl ether acetate, propylene glycol monobutyl ether, propylene glycol monomethyl ether, propylene glycol monoethyl ether, dipropylene glycol monomethyl ether, dipropylene glycol dimethyl ether, dipropylene glycol methyl ethyl ether, propylene glycol monomethyl ether acetate, 3-methoxy-1-butanol, ethyl formate, propyl formate, butyl formate, amyl formate, methyl acetate, ethyl acetate, propyl acetate, butyl acetate, methyl propionate, ethyl propionate, methyl butyrate, ethyl butyrate, methyl lactate, ethyl lactate, dimethylformamide, dimethylsulfoxide, dioxane, acetone, methyl ethyl ketone, cyclohexanone, methylcyclohexanone, diacetone alcohol, acetylacetone, γ-butyrolactone, diethyl ketone and 4-hydroxy-2butanone. These solvents may be used singly or in combination of two or more.

As a coating method used for coating the light-sensitive composition on the surface of a support, there may be used a conventionally known method, for example, rotational coating, wire bar coating, dip coating, air knife coating, spray coating, air spray coating, static air spray coating, roll coating, blade coating and curtain coating. The amount to be coated varies depending on the use, but may be preferably, for example, 0.05 to 5.0 g/m² as a solid component.

Next, the support to be used for preparing the light-sensitive lithographic printing plate of the present invention is described.

The support is preferably a support which is flexible enough to be set in a conventional printing machine and can stand load applied during printing, and there may be used, for example, a plate of a metal such as aluminum, magnesium, zinc, chromium, iron, copper and nickel, a plate of an alloy of these metals and a metal plate coated thereon with chromium, zinc, copper, nickel, aluminum or iron by plating or vapor deposition. Among them, aluminum or an alloy thereof is preferred as the support.

Various aluminum alloys may be used and there may be mentioned, as the aluminum alloys, an alloy of aluminum and a metal such as silicon, copper, manganese, magnesium, chromium, zinc, lead, bismuth and nickel.

The support formed of aluminum, an alloy thereof or the like is generally subjected to degreasing treatment before graining treatment in order to remove oil components such as rolling oil attached on the surface of the support. As the degreasing treatment, there may be used degreasing treatment using a solvent such as Tri-Clene (trade name, produced by Toagosei Chemical Industry Co., Ltd.) and a thinner and emulsion degreasing treatment using an emulsion such as kerosine and triethanol. In the degreasing treatment, an aqueous solution of an alkali such as sodium hydroxide may be used. When the aqueous solution of an alkali such as sodium hydroxide is used in the degreasing treatment, it is possible to remove stain and an oxidized film which cannot be removed only by the above degreasing treatment.

The graining treatment of the present invention can be carried out by using a known method such as the so-called mechanical rohghening method in which a surface is roughened mechanically, the so-called chemical toughening method in which a surface is selectively dissolved chemically and the so-called electrochemical roughening method in which a surface is roughened electrochemically.

The mechanical roughening method includes, for example, methods such as ball grinding, brush grinding, blast grinding and buff grinding. The electrochemical toughening method includes, for example, a method of electrolysis treatment in an electrolyte containing hydrochloric acid or nitric acid by alternating current or direct current.

The graining treatment of the present invention can be carried out by using either one of the above methods or a combination of two or more of them.

On the surface of the support obtained by the graining treatment, smut is generated. In order to remove the smut, it is generally preferred to carry out suitable treatment such as washing or alkaline etching. As such a treatment, there may be mentioned, for example, the alkaline etching method described in Japanese Patent Publication No. 28123/1973 and the sulfuric acid desmutting method described in Japanese Provisional Patent Publication No. 12739/1978.

The support treated as described above is then subjected to anodization treatment. By the anodization treatment, abrasion resistance, chemical resistance and water retention can be improved. The anodization treatment can be carried out by using a known method and, for example, a method in which electrolysis is effected at a current density of 1 to 10 A/dm² by using an aqueous solution containing 10 to 50% of sulfuric acid and/or phosphoric acid as an electrolyte is preferably used. Also, there may be used a method in which electrolysis is effected in sulfuric acid at a high current density described in U.S. Pat. No. 1,412,768 and a method in which electrolysis is effected by using phosphoric acid described in U.S. Pat. No. 3,511,661.

The support subjected to the anodization treatment may be subjected to pore-sealing treatment, if necessary. The pore-sealing treatment can be carried out by a known method such as hot water treatment, boiled water treatment, water vapor treatment, treatment using sodium silicate, treatment using a dichromate aqueous solution, treatment using nitrite and treatment using ammonium acetate.

It is preferred to further provide a hydrophilic layer on the support. For forming the hydrophilic layer, a water-soluble polymer, an alkali metal silicate described in U.S. Pat. No. 3,181,461, amino acid and a salt thereof described in Japanese Provisional Patent Publication No. 165183/1988, an amine having a hydroxyl group and a salt thereof described in Japanese Provisional Patent Publication No. 232998/1985, phosphate described in Japanese Provisional Patent Publication No. 19494/1987 and a polymeric compound having a monomer unit having a sulfo group described in Japanese Provisional Patent Publication No. 101651/1984 may be used. In the present invention, the following compounds are preferably used.

(1) Water-soluble polymer

As a specific example, there may be mentioned a vinyl type resin and a derivative thereof such as PVA (polyvinyl alcohol), a modified PVA, PVAP (polyvinylphosphoric acid), polyvinyl pyrrolidone and polyvinyl imidazoline; an acrylic acid type copolymer such as polyacrylic acid, polyacrylamide and polyhydroxyethyl acrylate; polyethyleneimine; a maleic acid copolymer; polyethylene glycol polyoxyethylene; polypropylene glycol; a polyurethane resin; polyhydroxymethyl urea; a polyhydroxymethyl melamine resin; soluble starch; CMC (carboxymethyl cellulose); hydroxyethyl cellulose; guar gum; tragacanth gum; xanthane gum; sodium alginate; and gelatin.

(2) Compound having at least one amino group and two or more groups selected from the group consisting of a phosphonic acid group

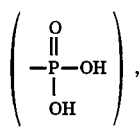

a phosphinic acid group

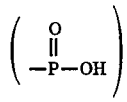

and a phosphoric acid group

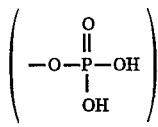

or a salt thereof.

As the compound having a phosphonic acid group or a salt thereof, there may be mentioned, for example, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid, 1-dimethylaminomethane-1,1-diphosphonic acid, 1-propylaminoethane-1,1-diphosphonic acid, 1-butylaminomethane-1,1-diphosphonic acid, aminotrimethylenephosphonic acid, ethylenediaminopentamethylenephosphonic acid, ethylenediaminotetramethylenephosphonic acid, diethylenetriaminopentamethylenephosphonic acid and aminotri(2-propylene-2-phosphonic acid), and hydrochlorides, formates and oxalates of these compounds. As the compound having a phosphinic acid group or a salt thereof, there may be mentioned compounds obtained by replacing a phosphonic acid group of the above compounds having a phosphonic acid group with a phosphinic acid group and salts thereof, for example, aminotrimethylenephosphinic acid. As the compound having a phosphoric acid or a salt thereof, there may be mentioned compounds obtained by replacing a phosphonic acid group of the above compounds having a phosphonic acid group with a phosphoric group and salts thereof, for example, aminotrimethylenephosphoric acid.

(3) Compound having at least one amino group and either a carboxyl group or a sulfone group, or a salt thereof As a specific example, there may be mentioned an amino acid such as aminoacetic acid, lysine, threonine, serine, aspartic acid, p-hydroxyphenylglycine, dihydroxyethylglycine, anthranilic acid, tryptophane and alginine; an aliphatic aminosulfonic acid such as sulfamic acid and cyclohexylsulfamic acid; and hydrochlorides, formates and oxalates of these compounds.

(4) Compound having at least one amino group and at least one hydroxyl group or a salt thereof As a specific example, there may be mentioned monoethanolamine, diethanolamine, trimethanolamine, tripropanolamine and triethanolamine, and hydrochlorides, formates and oxalates of these compounds.

(5) Alkane having at least two amino groups and a salt thereof

The alkane includes straight, branched and cyclic alkanes. Particularly preferred is $NH_2-(CH_2)_n-NH_2$ (where n represents an integer of 2 to 10).

As a specific example, there may be mentioned ethylenediamine, 1,3-diaminopropane, 1,4-diaminobutane, 1,2-diaminopropane, 1,2-diamino-2-methylpropane, 1,5-diaminopentane, 1,6-diaminohexane, 1,7-diaminoheptane, 1,2-diaminocyclohexane, 1,8-diaminooctane, 1,9-diaminononane and 1,10-diaminodecane, and hydrochlorides, formates and oxalates of these compounds.

The positive type light-sensitive lithographic printing plate of the present invention can be processed by carrying out exposure and development according to a conventional method. For example, a transparent original picture having a line image or a dot image is closely contacted to a light-sensitive surface and subjected to exposure, and then a light-sensitive layer at a non-image portion is removed by using a suitable developing solution to obtain a relief image.

As a suitable light source for exposure, there may be used a mercury lamp, a metal halide lamp, a xenon lamp, a chemical lamp and a carbon arc lamp. As the developing solution and developing replenishing solution to be used for development, an alkaline aqueous solution is preferred. For example, an alkaline aqueous solution such as an aqueous solution of an alkali metal silicate (e.g., sodium silicate and potassium silicate), sodium hydroxide, potassium hydroxide, sodium tertiary phosphate, sodium secondary phosphate, sodium carbonate or potassium carbonate may be used.

In the present invention, both of the developing solution and the developing replenishing solution to be used for developing the light-sensitive lithographic printing plate contain an alkali metal silicate. An alkali metal of the alkali metal silicate is lithium, sodium or potassium and among them, potassium is most preferred.

When development is carried out, it is preferred to replenish a developing replenishing solution suitably depending on the development processing amount of the light-sensitive lithographic printing plate.

Preferred developing solution and developing replenishing solution are an aqueous solution of an alkali metal silicate having $[SiO_2]/[M]$ (where $[SiO_2]$ represents a molar concentration of $SiO_2$ and [M] represents a molar concentration of an alkali metal) of 0.15 to 1.0 and a $SiO_2$ concentration of 0.5 to 5.0% by weight based on the total weight of the solution. It is particularly preferred that the developing solution has $[SiO_2]/[M]$ of 0.25 to 0.75 and a $SiO_2$ concentration of 1.0 to 4.0% by weight, and the developing replenishing solution has $[SiO_2]/[M]$ of 0.15 to 0.5 and a $SiO_2$ concentration of 1.0 to 3.0% by weight.

The pH of the developing solution or the developing replenishing solution is preferably 11 to 14, particularly preferably 12 to 13.8.

In the above developing solution and developing replenishing solution, a water-soluble or alkali-soluble organic or inorganic reducing agent.

As the organic reducing agent, there may be mentioned, for example, a phenol compound such as hydroquinone, metol and methoxyquinone, and an amine compound such as phenylenediamine and phenylhydrazine. As the inorganic reducing agent, there may be mentioned, for example, a sulfite such as sodium sulfite, potassium sulfite, ammonium sulfite, sodium hydrogen sulfite and potassium hydrogen sulfite; a phosphite such as sodium phosphite, potassium phosphite, sodium hydrogen phosphite, potassium hydrogen phosphite, disodium hydrogen phosphite and dipotassium hydrogen phosphite; hydrazine, sodium thiosulfate and sodium dithionite.

In the developing solution and the developing replenishing solution, 0.05 to 10% by weight of the water-soluble or alkali-soluble reducing agent may be contained.

In the developing solution and the developing replenishing solution, an organic carboxylic acid may be also contained.

The organic carboxylic acid includes an aliphatic carboxylic acid having 6 to 20 carbon atoms and an aromatic carboxylic acid in which a carboxyl group is substituted on a benzene ring or a naphthalene ring.

As the aliphatic carboxylic acid, an alkanoic acid having 6 to 20 carbon atoms is preferred. As a specific example, there may be mentioned caproic acid, enanthylic acid, caprylic acid, pelargonic acid, capric acid, lauric acid, myristic acid, palmitic acid and stearic acid, particularly preferably an alkanoic acid having 6 to 12 carbon atoms. The aliphatic carboxylic acid may be either an aliphatic acid having a double bond in a carbon chain or an aliphatic acid having a branched carbon chain. The above aliphatic carboxylic acid may be used in the form of a sodium or potassium salt or an ammonium salt.

As a specific compound of the aromatic carboxylic acid, there may be mentioned benzoic acid, o-chlorobenzoic acid, p-chlorobenzoic acid, o-hydroxybenzoic acid, p-hydroxybenzoic acid, p-tert-butylbenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid.

The above aromatic carboxylic acid may be used in the form of a sodium or potassium salt or an ammonium salt.

The aliphatic carboxylic acid or the aromatic carboxylic acid may be contained in an amount of at least 0.1 to 30% by weight.

In the developing solution and the developing replenishing solution, the respective anionic, nonionic and cationic surfactant and organic solvent described below may be contained.

As the anionic surfactant, there may be mentioned a salt of a higher alcohol ($C_6$ to $C_{22}$) sulfate (e.g., a sodium salt of lauryl alcohol sulfate, a sodium salt of octyl alcohol sulfate, an ammonium salt of lauryl alcohol sulfate, "Teepol-81" (trade name produced by Shell Chemical Co.) and disodium alkyl sulfate), a salt of aliphatic alcohol phosphate (e.g., a sodium salt of cetyl alcohol phosphate), a salt of alkylarylsulfonic acid (e.g., a sodium salt of dodecylbenzenesulfonic acid, a sodium salt of isopropylnaphthalenesulfonic acid, a sodium salt of dinaphthalenedisulfonic acid and a sodium salt of metanitrobenzenesulfonic acid), a sulfonate of alkylamide (e.g., $C_{17}H_{33}CON(CH_3)CH_2SO_3Na$) and a sulfonate or sulfosuccinate of a dibasic aliphatic acid ester (e.g., dioctyl sodium sulfosuccinate and dihexyl sodium sulfosuccinate). Among them, a sulfonate is particularly suitably used.

As the nonionic surfactant, either a polyethylene glycol type surfactant or a polyvalent alcohol type surfactant may be used.

As the nonionic surfactant, there may be mentioned, for example, compounds represented by the following formulae (1) to (8).

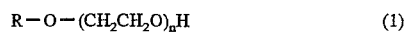

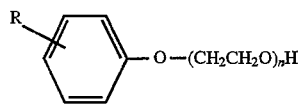

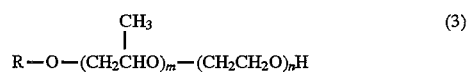

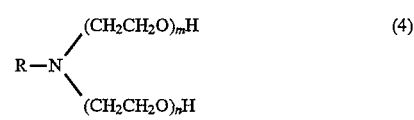

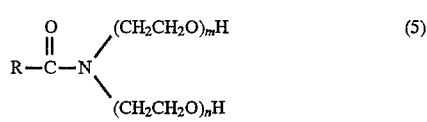

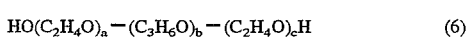

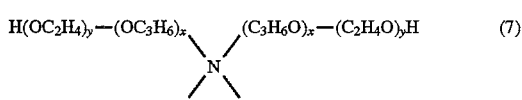

In the formulae (1) to (8), R represents a hydrogen atom or a monovalent organic group, and a, b, c, m, n, x and y each represent an integer of 1 to 40.

As an organic group represented by R, there may be mentioned, for example, a straight or branched alkyl group having 1 to 30 carbon atoms, an alkyl group having a substituent (e.g., an aryl group such as phenyl), an alkyl-carbonyl group in which an alkyl portion is a straight or branched alkyl group having 1 to 30 carbon atoms and a phenyl group which may have a substituent(s) (e.g., a hydroxyl group and the above alkyl group).

Specific examples of the nonionic surfactant are shown below:

polyethylene glycol, polyoxyethylene lauryl ether, polyoxyethylene nonyl ether, polyoxyethylene cetyl ether, polyoxyethylene allyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, an oxyethylene oxypropylene block polymer, a distyrenated phenol polyethylene oxide adduct, a tribenzylphenol polyethylene oxide adduct, an octylphenol polyoxyethylene polyoxypropylene adduct, glycerol monostearate, sorbitan monolaurate and polyoxyethylene sorbitan monolaurate.

The weight average molecular weight of the nonionic surfactant is preferably in the range of 300 to 10,000. The concentration of the nonionic surfactant in the developing solution may be 0.001 to 10% by weight.

The cationic surfactant is roughly classified into an amine type surfactant and a quaternary ammonium salt type surfactant, and both of them may be used.

As an example of the amine type surfactant, there may be mentioned polyoxyethylenealkylamine, N-alkylpropyleneamine, N-alkylpolyethylenepolyamine, N-alkylpolyethylenepolyaminedimethylsulfate, alkylbiguanide, long-chain amine oxide, alkylimidazoline, 1-hydroxyethyl-2-alkylimidazoline, 1-acetylaminoethyl-2-alkylimidazoline and 2-alkyl-4-methyl-4-hydroxymethyloxazoline.

As an example of the quaternary ammonium salt type surfactant, there may be mentioned a long-chain primary amine salt, an alkyl trimethylammonium salt, a dialkyl dimethylethylammonium salt, an alkyl dimethylammonium salt, an alkyl dimethylbenzylammonium salt, an alkyl pyridinium salt, an alkyl quinolinium salt, an alkyl isoquinolinium salt, alkyl pyridinium sulfate, a stearamide methylpyridinium salt, an acylaminoethyldiethylamine salt, an acylaminoethylmethyldiethylammonium salt, an alkylamidopropyldimethylbenzylammonium salt, aliphatic acid polyethylene polyamide, an acylaminoethylpyridinium salt, an acylcolaminoformylmethylpyridinium salt, a stearoxymethylpyridinium salt, aliphatic acid triethanolamine, aliphatic acid triethanolamine formate, trioxyethylene aliphatic acid triethanolamine, aliphatic acid dibutylaminoethanol, a cetyloxymethylpyridinium salt and a p-isooctylphenoxyethoxyethyldimethylbenzylammonium salt ("alkyl" in the above exemplary compounds represents a straight or partially substituted alkyl having 6 to 20 carbon atoms, preferably a straight alkyl such as hexyl, octyl, cetyl and stearyl).

Further, as the cationic surfactant, a polymer having a cationic component as a recurring unit, for example, a polymer containing a quaternary ammonium salt obtained by copolymerization with a lipophilic monomer may be contained.

The amount of the cationic surfactant to be added to the developing solution may be in the range of 0.001 to 10% by weight.

The cationic surfactant having a weight average molecular weight of 300 to 50,000 may be used.

As the surfactant, it is preferred to use a fluorine type surfactant having a perfluoroalkyl group in a molecule. As such a fluorihe type surfactant, there may be mentioned an anionic surfactant such as perfluoroalkylcarboxylate, perfluoroalkylsulfonate and perfluoroalkylphosphate; an amphoteric surfactant such as perfluoroalkylbetaine; a cationic surfactant such as a perfluoroalkyltrimethylammonium salt; and a nonionic surfactant such as perfluoroalkylamine oxide, a perfluoroalkylethylene oxide adduct, an oligomer having a perfluoroalkyl group and a hydrophilic group, an oligomer having a perfluoroalkyl group and a lipophilic group, an oligomer having a perfluoroalkyl group, a hydrophilic group and a lipophilic group and urethane having a perfluoroalkyl group and a lipophilic group.

The above surfactants may be used singly or in combination of two or more.

As the organic solvent, an organic solvent having a solubility in water at 20° C. of 10% by weight or less is preferred and there may be mentioned, for example, a carboxylate such as ethyl acetate, propyl acetate, butyl acetate, benzyl acetate, ethylene glycol monobutyl acetate, butyl lactate and butyl levulinate; a ketone such as ethyl butyl ketone, methyl isobutyl ketone and cyclohexanone; an alcohol such as ethylene glycol monobutyl ether, ethylene glycol benzyl ether, ethylene glycol monophenyl ether, benzyl alcohol, methylphenyl carbinol, n-amyl alcohol and methylamyl alcohol; an alkyl-substituted aromatic hydrocarbon such as xylene; and a halogenated hydrocarbon such as methylene dichloride, ethylene dichloride and monochlorobenzene.

These organic solvents may be used singly or in combination of two or more.

To the developing solution and the developing replenishing solution, the following additives may be added for the purpose of heightening developability. As the additives, there may be mentioned, for example, a neutral salt such as NaCl, KCl and KBr described in Japanese Provisional Patent Publication No. 75152/1983, a chelating agent such as EDTA (ethylenediaminetetraacetic acid) and NTA (nitrilotriacetic acid) described in Japanese Provisional Patent Publication No. 190952/1984, a complex such as $[Co(NH_3)]_6Cl_3$ described in Japanese Provisional Patent Publication No. 121336/1984, an amphoteric polymeric electrolyte such as a copolymer of vinylbenzyltrimethylammonium chloride and sodium acrylate described in Japanese Provisional Patent Publication No. 142528/1981, an inorganic lithium compound such as lithium chloride described in Japanese Provisional Patent Publication No. 59444/1983, an organic lithium compound such as lithium benzoate described in Japanese Patent Publication No. 34442/1975, an organometallic surfactant containing Si or Ti described in Japanese Provisional Patent Publication No. 75255/1984 and an organic boron compound described in Japanese Provisional Patent Publication No. 84241/1984.

Further, known additives may be added to the developing solution and the developing replenishing solution.

EXAMPLES

The present invention is described in detail by referring to Examples, but the present invention is not limited thereby.

Example 1

(Preparation of Support 1)

An aluminum plate (material: 1050, tempering: H16) having a thickness of 0.3 mm was degreased in a 5% sodium hydroxide aqueous solution maintained at 65° C. for 1 minute, washed, dipped in a 10% sulfuric acid aqueous solution maintained at 25° C. for 1 minute to neutralize and further washed. The aluminum plate was electrolytically roughened in a 1.0% by weight hydrochloric acid aqueous solution under conditions of a temperature of 25° C., a current density of 100 A/dm$^2$ and a treatment time of 60 seconds by alternating current. Thereafter, the plate was desmutted in a 5% sodium hydroxide aqueous solution at 60° C. for 10 seconds and then anodized in a 20% sulfuric acid solution under conditions of a temperature of 20° C., a current density of 3 A/dm$^2$ and a treatment time of 1 minute. Thereafter, the plate was dipped in a 1% sodium nitrite aqueous solution maintained at 80° C. for 30 seconds, washed and then dried at 80° C. for 3 minutes. Further, the plate was dipped in a carboxymethyl cellulose aqueous solution (concentration: 0.1% by weight) maintained at 85° C. for 30 minutes and then dried at 80° C. for 5 minutes to prepare Support 1.

(Preparation of Support 2)

An aluminum plate (material: 1050, tempering: H16) having a thickness of 0.3 mm was degreased in a 5% sodium hydroxide aqueous solution maintained at 65° C. for 1 minute, washed, dipped in a 10% sulfuric acid aqueous solution maintained at 25° C. for 1 minute to neutralize and further washed. The aluminum plate was electrolytically roughened in a 1.0% by weight hydrochloric acid aqueous solution under conditions of a temperature of 25° C., a current density of 100 A/dm$^2$ and a treatment time of 60 seconds by alternating current. Thereafter, the plate was desmutted in a 5% sodium hydroxide aqueous solution at 60° C. for 10 seconds and then anodized in a 20% sulfuric acid solution under conditions of a temperature of 20° C., a current density of 3 A/dm$^2$ and a treatment time of 1 minute. Thereafter, the plate was dipped in a 1% sodium nitrite aqueous solution maintained at 80° C. for 30 seconds, washed and then dried at 80° C. for 3 minutes to prepare Support 2.

(Preparation of light-sensitive lithographic printing plate samples)

On Support 1, coating solutions having compositions shown below and in Table 1 were coated by using a wire bar, respectively, and dried at 80° C. for 2 minutes to obtain Light-sensitive lithographic printing plate samples ① to ⑦ and Light-sensitive lithographic printing plate comparative samples ① and ②.

(Coating solution 1)

| | |
|---|---|
| (1) Novolak resin (molar ratio of phenol/m-cresol/ p-cresol: 10/54/36, weight average molecular weight: 4,000) | 6.7 g |
| (2) Condensate of pyrogallol acetone resin (weight average molecular weight: shown in Table 1) and o-naphthoquinonediazide-2-sulfonyl chloride (esterification ratio: 30%) | 1.5 g |
| (3) Polyethylene glycol #2000 (trade name, produced by Daiichi Kogyo Seiyaku Co.) | 0.2 g |
| (4) Victoria Pure Blue BOH (trade name, produced by Hodogaya Kagaku K.K.) | 0.08 g |
| (5) 2,4-bis(trichloromethyl)-6-(p-methoxystyryl)-s-triazine | 0.15 g |
| (6) FC-430 (trade name, produced by Sumitomo 3M K.K.) | 0.03 g |
| (7) cis-1,2-cyclohexanedicarboxylic acid | 0.2 g |
| (8) Clathrate compound shown in Table 1 | 0.2 g |
| (9) Methyl cellosolve | 100 ml |

(Coating solution 2)

| | |
|---|---|
| (1) Novolak resin (molar ratio of phenol/m-cresol/ p-cresol: 10/54/36, weight average molecular weight: 4,000) | 6.7 g |
| (2) Condensate of m-cresol formaldehyde resin (weight average molecular weight: 3,000) and o-naphthoquinonediazide-5-sulfonyl chloride (esterification ratio: 30%) | 1.5 g |
| (3) Polyethylene glycol #2000 (trade name, produced by Daiichi Kogyo Seiyaku Co.) | 0.2 g |
| (4) Victoria Pure Blue BOH (trade name, produced by Hodogaya Kagaku K.K.) | 0.08 g |
| (5) 2,4-bis(trichloromethyl)-6-(p-methoxystyryl)-s-triazine | 0.15 g |
| (6) FC-430 (trade name, produced by Sumitomo 3M K.K.) | 0.03 g |
| (7) cis-1,2-cyclohexanedicarboxylic acid | 0.2 g |
| (8) Clathrate compound shown in Table 1 | 0.2 g |
| (9) Methyl cellosolve | 100 ml |

TABLE 1

| Support | Coating solution | Weight average molecular weight | Clathrate compound | |
|---|---|---|---|---|
| Support 1 | Coating solution 1 | 2,500 | Hydroxypropyl-β-cyclodextrin | Sample ① |
| | | 3,000 | α-cyclodextrin | Sample ② |
| | | | β-cyclodextrin | Sample ③ |
| | | | γ-cyclodextrin | Sample ④ |
| | | | Hydroxypropyl-β-cyclodextrin | Sample ⑤ |
| | | | Compound-1 shown below | Sample ⑥ |
| | | | not added | Comparative sample ① |
| | Coating solution 2 | 3,000 | Hydroxypropyl-β-cyclodextrin | Sample ⑦ |
| | | | β-cyclodextrin not added | Comparative Sample ② |

Compound-1

For the above Samples ① to ⑦ and Comparative samples ① and ②, sensitivity, erasability of a film edge portion and press life were evaluated according to the following evaluation methods.

(Evaluation methods)

<Evaluation of sensitivity>

A step tablet No. 2 (trade name, produced by Eastman Kodak Co., each concentration difference of 0.15, gray scale of 21 grades) for measuring sensitivity was closely contacted with a sample, and the sample was exposed to light from a distance of 90 cm by using a 4 kW metal halide lamp Vio Quick (trade name, produced by Dainippon Screen K.K.) as a light source. Then, the sample was developed by using Developing solution A shown below at 30° C. for 12 seconds.

Sensitivity was determined by an exposure time until 3.0 grade of the above step tablet was completely clear.

<Evaluation of erasability of film edge portion>

A step tablet No. 2 (trade name, produced by Eastman Kodak Co., each concentration difference of 0.15, gray scale of 21 grades) for measuring sensitivity was closely contacted with a sample, and the sample was exposed to light from a distance of 90 cm by using a 4 kW metal halide lamp Vio Quick (trade name, produced by Dainippon Screen K.K.) as a light source. Then, the sample was developed by using Developing solution B shown below at a developing temperature of 30° C. for a developing time of 12 seconds and washed. The step portion was erased by using an erasing solution SIR-16 (trade name, produced by Konica Corporation). On the resulting printing plate, a developing ink SPO-1 (trade name, produced by Konica Corporation) was inked to evaluate erasability according to the following evaluation standard.

Evaluation standard

O: The developing ink was not inked.

X: The developing ink was inked.

<Evaluation of press life>

A step tablet No. 2 (trade name, produced by Eastman Kodak Co., each concentration difference of 0.15, gray scale of 21 grades) for measuring sensitivity was closely contacted with a sample, and the sample was exposed from a distance of 90 cm by using a 4 kW metal halide lamp Vio Quick (trade name, produced by Dainippon Screen K.K.) as a light source. Then, the sample was developed by using Developing solution A shown below at 30° C. for 12 seconds.

The lithographic printing plate obtained was set in a printing machine Heidelberg GTO (trade name, produced by Heidelberger Druckinaschinen AG (Germany)), and printing was carried out by using a coated paper, a printing ink New Bright Magenta (trade name, produced by Toyo Ink Seizo K.K.) and a plate etch aqueous solution SEU-3 (2.5%, trade name, produced by Konica Corporation). The printing was continued until inking failure was caused at a solid image portion of a printed paper or a non-image portion was inked, and a number of printed papers until then was counted.
(Recipe of developing solutions)

<Developing solution A>

| | |
|---|---|
| A potassium silicate aqueous solution (produced by Nihon Kagaku Kogyo K.K.) | 75 g |
| Potassium hydroxide aqueous solution (50%) | 55 g |
| Pure water | 850 g |
| [$SiO_2$]/[K] (molar ratio) | 0.55 |
| $SiO_2$ (% by weight) | 2.0 |
| pH = 12.8 | |

<Developing solution B>

| | |
|---|---|
| A potassium silicate aqueous solution (produced by Nihon Kagaku Kogyo K.K.) | 110 g |
| Potassium hydroxide aqueous solution (50%) | 90 g |
| Pure water | 800 g |
| [$SiO_2$]/[K] (molar ratio) | 0.50 |
| $SiO_2$ (% by weight) | 3.0 |
| pH = 13.0 | |

The evaluation results are shown in Table 2.

TABLE 2

| | Sensitivity (second) | Erasability of film edge portion | Press life (in ten thousands of sheets) |
|---|---|---|---|
| Sample ① | 15 | ○ | 15 |
| Sample ② | 25 | ○ | 20 |
| Sample ③ | 25 | ○ | 20 |
| Sample ④ | 25 | ○ | 20 |
| Sample ⑤ | 20 | ○ | 20 |
| Sample ⑥ | 25 | ○ | 20 |
| Sample ⑦ | 20 | ○ | 10 |
| Comparative sample ① | 30 | X | 20 |
| Comparative sample ② | 30 | X | 10 |

Example 2

(Preparation of light-sensitive lithographic printing plate samples)

On Support 1 or 2 described in Example 1, the following Coating solution 3 or Coating solution 4 was coated as shown in Table 3 by using a wire bar, and dried at 80° C. for 2 minutes to obtain Light-sensitive lithographic printing plate samples ⑧ to ⑨ and Light-sensitive lithographic printing plate comparative sample ③.

(Coating solution 3)

| | |
|---|---|
| (1) Novolak resin (molar ratio of phenol/m-cresol/ p-cresol: 10/54/36, weight average molecular weight: 4,000) | 6.7 g |
| (2) Condensate of pyrogallol acetone resin (weight average molecular weight: 3,000) and o-naphthoquinonediazide-5-sulfonyl chloride (esterification ratio: 30%) | 1.5 g |

-continued

| | |
|---|---|
| (3) Polyethylene glycol #2000 (trade name, produced by Daiichi Kogyo Seiyaku Co.) | 0.2 g |
| (4) Victoria Pure Blue BOH (trade name, produced by Hodogaya Kagaku K.K.) | 0.08 g |
| (5) 2,4-bis(trichloromethyl)-6-(p-methoxystyryl)-s-triazine | 0.15 g |
| (6) FC-430 (trade name, produced by Sumitomo 3M K.K.) | 0.03 g |
| (7) cis-1,2-cyclohexanedicarboxylic acid | 0.2 g |
| (8) Hydroxypropyl-β-cyclodextrin | 0.2 g |
| (9) Methyl cellosolve | 100 ml |

(Coating solution 4)

| | |
|---|---|
| (1) Novolak resin (molar ratio of phenol/m-cresol/ p-cresol: 10/54/36, weight average molecular weight: 4,000) | 6.7 g |
| (2) Condensate of pyrogallol acetone resin (weight average molecular weight: 3,000) and o-naphthoquinonediazide-5-sulfonyl chloride (esterification ratio: 30%) | 1.5 g |
| (3) Polyethylene glycol #2000 (trade name, produced by Daiichi Kogyo Seiyaku Co.) | 0.2 g |
| (4) Victoria Pure Blue BOH (trade name, produced by Hodogaya Kagaku K.K.) | 0.08 g |
| (5) 2,4-bis(trichloromethyl)-6-(p-methoxystyryl)-s-triazine | 0.15 g |
| (6) FC-430 (trade name, produced by Sumitomo 3M K.K.) | 0.03 g |
| (7) cis-1,2-cyclohexanedicarboxylic acid | 0.2 g |
| (8) Methyl cellosolve | 100 ml |

TABLE 3

| | Support | Coating solution |
|---|---|---|
| Sample ⑧ | Support 1 | Coating solution 3 |
| Sample ⑨ | Support 2 | Coating solution 3 |
| Comparative sample ③ | Support 1 | Coating solution 4 |

A manuscript film with a step tablet No. 2 (trade name, produced by Eastman Kodak Co., each concentration difference of 0.15, gray scale of 21 grades) for measuring sensitivity was closely contacted with a sample obtained, and the sample was exposed to light from a distance of 90 cm for 25 seconds by using a 4 kW metal halide lamp Vio Quick (trade name, produced by Dainippon Screen K.K.) as a light source. Then, the sample was subjected to running treatment up to 100 m²/l by using Developing solutions A, C, D and E shown below, respectively. During the running treatment, Developing solutions A, C, D and E shown below were replenished so that the grade of gray scale was always 4 grade.
(Recipe of developing solutions)
<Developing solution A>

Developing solution A described in Example 1

<Developing solution C>

| | |
|---|---|
| A potassium silicate aqueous solution (produced by Nihon Kagaku Kogyo K.K.) | 180 g |
| Potassium hydroxide aqueous solution (50%) | 40 g |
| Pure water | 750 g |
| [$SiO_2$]/[K] (molar ratio) | 0.9 |
| $SiO_2$ (% by weight) | 5.0 |
| pH = 12.5 | |

<Developing solution D>

| | |
|---|---|
| A potassium silicate aqueous solution (produced by Nihon Kagaku Kogyo K.K.) | 30 g |
| Potassium hydroxide aqueous solution (50%) | 28 g |

-continued

| | |
|---|---|
| Propylene glycol | 20 g |
| p-tert-Butylbenzoic acid | 5 g |
| Triethanolamine | 10 g |
| Potassium sulfite aqueous solution (50%) | 30 g |
| Pelex NBL (trade name, produced by Kao K.K.) | 5 g |
| EDTA | 0.5 g |
| Gluconic acid aqueous solution (50%) | 10 g |
| Emulgen 147 (trade name, produced by Kao K.K.) | 2 g |
| Pure water | 800 g |
| [SiO$_2$]/[K] (molar ratio) | 0.4 |
| SiO$_2$ (% by weight) | 0.8 |
| pH = 12.9 | |

<Developing solution E>

| | |
|---|---|
| A potassium silicate aqueous solution (produced by Nihon Kagaku Kogyo K.K.) | 240 g |
| Potassium hydroxide aqueous solution (50%) | 100 g |
| Pure water | 660 g |
| [SiO$_2$]/[K] (molar ratio) | 0.85 |
| SiO$_2$ (% by weight) | 6.5 |
| pH = 12.8 | |

(Recipe of developing replenishing solutions)

<Developing replenishing solution A>

| | |
|---|---|
| A potassium silicate aqueous solution (produced by Nihon Kagaku Kogyo K.K.) | 40 g |
| Potassium hydroxide aqueous solution (50%) | 90 g |
| Active agent 1 shown below | 1.3 g |

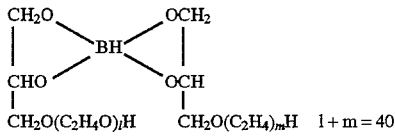

CH$_2$O(C$_2$H$_4$O)$_l$H   CH$_2$O(C$_2$H$_4$)$_m$H   l + m = 40

| | |
|---|---|
| [SiO$_2$]/[K] (molar ratio) | 0.2 |
| SiO$_2$ (% by weight) | 1.0 |
| pH = 13.3 | |

<Developing replenishing solution C>

| | |
|---|---|
| A potassium silicate aqueous solution (produced by Nihon Kagaku Kogyo K.K.) | 170 g |
| Potassium hydroxide aqueous solution (50%) | 140 g |
| Pure water | 700 g |
| [SiO$_2$]/[K] (molar ratio) | 0.4 |
| SiO$_2$ (% by weight) | 4.5 |
| pH = 13.8 | |

<Developing replenishing solution D>

| | |
|---|---|
| A potassium silicate aqueous solution (produced by Nihon Kagaku Kogyo K.K.) | 30 g |
| Potassium hydroxide aqueous solution (50%) | 56 g |
| Propylene glycol | 19 g |
| p-tert-Butylbenzoic acid | 10 g |
| Triethanolamine | 15 g |
| Potassium sulfite aqueous solution (50%) | 65 g |
| Pelex NBL (trade name, produced by Kao K.K.) | 5 g |
| EDTA | 0.5 g |
| Gluconic acid aqueous solution (50%) | 9 g |
| Emulgen 147 (trade name, produced by Kao K.K.) | 2 g |
| Pure water | 700 g |
| [SiO$_2$]/[K] (molar ratio) | 0.25 |
| SiO$_2$ (% by weight) | 0.9 |
| pH = 13.4 | |

<Developing replenishing solution E>

| | |
|---|---|
| A potassium silicate aqueous solution (produced by Nihon Kagaku Kogyo K.K.) | 225 g |
| Potassium hydroxide aqueous solution (50%) | 190 g |
| Pure water | 580 g |
| [SiO$_2$]/[K] (molar ratio) | 0.5 |
| SiO$_2$ (% by weight) | 6.0 |
| pH = 13.3 | |

Each sample was subjected to 100 m$^2$/l treatment by using an automatic processor PSZ-910 (trade name, produced by Konica Corporation) for PS plate while sensitivity was maintained constantly by the developing solutions and developing replenishing solutions shown in Table 4. After the 100 m$^2$/l treatment, erasability of a film edge portion of each sample was evaluated in the same manner as in Example 1. Also, a weight of precipitates was measured to evaluate a state of generation of precipitates according to the following evaluation method.

The results obtained are shown in Table 4.

(Evaluation method)

<Measurement of weight of precipitates>

100 ml of a processing fatigue solution when each sample was subjected to 10 m$^2$/l treatment was collected and left to stand for 2 weeks. The solution was filtered by suction filtration, and precipitates remaining on a filter paper were washed sufficiently, dried and weighed.

<Evaluation of state of generation of precipitates>

A state of generation and washing-away easiness of precipitates in a tank when an automatic processor was washed after 100 m$^2$/l treatment were evaluated visually with naked eyes.

Evaluation standard

O: Almost no generation of precipitates in a tank was observed, and the precipitates were washed away easily by washing with water.

Δ: Generation of precipitates in a tank was observed, and the precipitates was washed away by washing with water.

X: Generation of a large amount of precipitates in a tank was observed, and it was difficult to wash away the precipitates by washing with water.

TABLE 4

| | Developing solution | Developing replenishing solution | Erasability of film edge portion | Weight of precipitates (mg) | State of generation of precipitates |
|---|---|---|---|---|---|
| Sample ⑧ | A | A | O | 2.2 | O |
| | C | C | O | 2.5 | O |
| | D | D | O | 10.5 | Δ |
| | E | E | O | 2.5 | O |
| Sample ⑨ | A | A | O | 5.3 | Δ |
| Comparative sample ③ | A | A | X | 4.5 | Δ |
| | D | D | X | 43.8 | X |

In the light-sensitive lithographic printing plate of the present invention, press life is not lowered, good sensitivity can be obtained, developability is good even in repeated development processing for a long period of time and also precipitates are not generated in a developing solution bath.

We claim:

1. In a light-sensitive lithographic printing plate which comprises a support subjected to graining treatment and anodization treatment and a layer of a positive light-sensitive composition containing an o-quinonediazide compound and an alkali-soluble resin provided on the support, the improvement wherein said layer of a positive light-sensitive composition comprises a cyclic clathrate compound which can include water or an organic molecule, said clathrate compound being contained in an amount of 0.01 to 10% by weight of said positive light-sensitive composition.

2. The plate of claim 1 wherein the o-quinonediazide compound is a polycondensed resin having an o-quinonediazide group and a weight average molecular weight of 3,000 to 10,000.

3. The plate of claim 1 wherein the o-quinonediazide compound is a polycondensed resin of pyrogallol having an o-quinonediazide group and an aldehyde or a ketone.

4. The plate of claim 1 wherein the alkali-soluble resin is at least one selected from the group consisting of a novolak resin, a vinyl polymer having a phenolic hydroxyl group and a condensed resin of a polyvalent phenol and either an aldehyde or a ketone.

5. The plate of claim 1 wherein the clathrate compound is at least one selected from the group consisting of cyclic D-glucans and cyclophans.

6. The plate of claim 1 wherein the clathrate compound is at least one selected from the group consisting of cyclodextrin and a cyclodextrin derivative.

7. The plate of claim 6 wherein the cyclodextrin in cyclodextrin and a cyclodextrin derivative is a β type cyclodextrin.

8. The plate of claim 7 wherein 1 to 3 molecules of maltose or glucose is bound to the β type cyclodextrin.

9. The plate of claim 1 wherein said positive light-sensitive composition comprises the clathrate compound in an amount of 0.1 to 5% by weight based on the total weight of said positive light-sensitive composition.

10. The plate of claim 1 wherein said positive light-sensitive composition comprises (a) 5 to 60% by weight of the o-quinonediazide compound, (b) 5 to 95% by weight of a novolak resin or 0.5 to 70% by weight of a vinyl polymer having a phenolic hydroxyl group and (c) 0.01 to 10% by weight of the clathrate compound, wherein each weight is based on the total weight of said positive light-sensitive composition.

11. The plate of claim 1 wherein the support is subjected to graining treatment, anodization treatment and pore-sealing treatment and then a hydrophilic layer is provided on the support.

* * * * *